United States Patent [19]

Staples

[11] Patent Number: 4,757,254
[45] Date of Patent: Jul. 12, 1988

[54] HIGH-SPEED SIDE ACCESS EDGE CONNECTOR TESTING ASSEMBLY

[75] Inventor: Robert E. Staples, Lakeville, Mass.

[73] Assignee: Augat Inc., Attleboro Falls, Mass.

[21] Appl. No.: 54,937

[22] Filed: May 27, 1987

[51] Int. Cl.[4] .................... G01R 1/02; G01R 15/12
[52] U.S. Cl. ...................... 324/158 F; 324/158 P; 324/73 PC; 324/73 AT
[58] Field of Search .......... 324/73 AT, 73 PC, 158 F, 324/158 P

[56] References Cited

U.S. PATENT DOCUMENTS

| | | | |
|---|---|---|---|
| 4,063,172 | 12/1977 | Faure et al. | 324/158 F X |
| 4,232,928 | 11/1980 | Wickersham | 324/158 P X |
| 4,342,957 | 8/1982 | Russell | 324/73 R |
| 4,342,958 | 8/1982 | Russell | 324/73 R |
| 4,535,536 | 8/1985 | Wyss | 29/845 |
| 4,536,051 | 8/1985 | Smith et al. | 324/73 PC X |
| 4,598,246 | 7/1986 | Staples et al. | 324/73 PC |
| 4,609,243 | 9/1986 | Wyss | 339/17 M |
| 4,625,164 | 11/1986 | Golder et al. | 324/158 |

Primary Examiner—Ernest F. Karlsen
Assistant Examiner—Vinh P. Nguyen
Attorney, Agent, or Firm—Weingarten, Schurgin, Gagnebin & Hayes

[57] ABSTRACT

A high speed edge connector tester having plural edge connector contacting is so movable as to plug and unplug the edge connector contacting probe contacts into and out of the edge connector of a unit under test. Plural automatic testing equipment (ATE) contacting probe contacts mounted to the carriage are individually connected to corresponding edge connector contacting contacts via non-flexing, minimum length electrically conductive wires. The linearly movable carriage, the edge contacting probe-contacts, and the automatic testing equipment contacting probe contacts, are mounted to a test fixture so movable as to electrically connect the ATE contacting probe contacts with the automatic testing equipment. A minimum path length electrical interconnection is established between the automatic testing equipment and the edge connector of the unit under test via the several probes and interconnecting wires.

10 Claims, 2 Drawing Sheets

HIGH-SPEED SIDE ACCESS EDGE CONNECTOR TESTING ASSEMBLY

BACKGROUND OF THE INVENTION

Test heads, such as those in U.S. Pat. Nos. 4,598,246 and 4,625,164, incorporated herein by reference, provide an interface by means of which electronic circuits are releasably reliably connected to automatic testing equipment operative to determine the integrity of the components, and cooperation between components, of the circuits.

A material disadvantage with the prior art test heads is a limitation in the speed with which the testing can be cyclically accomplished. One cause of the time delay has to do with the electrical path lengths. The longer the path lengths, the more time the electrical signal needs to propagate, the less the through-put of multiple devices to be tested. Another cause of the time delay is the transients induced by the capacitance, the inductance and other electrical properties of the wires, which transients must be allowed to settle before testing can proceed. Both effects depend directly on the total extension or length of the signal paths, and in the heretofore known testing heads, particularly those equipped for testing edge connector contacts of electric circuit devices, the wire lengths often are on the order of a full foot and one-half in length, which correlates with several milliseconds of lost time per cycle, and which represents undesirable if not unacceptable through-put delays.

SUMMARY OF THE INVENTION

In accordance with the principal object of the present invention, there is disclosed a high-speed edge connector tester, in accordance with which plural edge connector contacting probe contacts are mounted to a linear carriage so movable as to plug and unplug the edge connector contacting probe contactors into and out of the edge connector of a unit under test. Plural automatic testing equipment (ATE) contacting probe contacts mounted to the carriage are individually connected to corresponding edge connector contacting contacts via non-flexing, minimum-length electrically conductive wires. The linearly movable carriage, the edge contacting probe contacts, and the automatic testing equipment contacting probe contacts, are mounted to a test fixture so movable as to electrically connect the ATE side access contacting probe contacts with the automatic testing equipment. A minimum path length electrical interconnection is established between the automatic testing equipment and the edge connector of the unit under test via the several probes and interconnecting wires. The present invention achieves at least an order of magnitude speed-up in the speeds of signal processing over the heretofore known devices.

BRIEF DESCRIPTION OF THE DRAWINGS

Other objects, aspects, and features of the instant invention will become apparent as the invention becomes better understood by referring to the following exemplary and nonlimiting detailed description thereof and to the drawings, wherein.

DETAILED DESCRIPTION OF THE INVENTION

Figure 1:
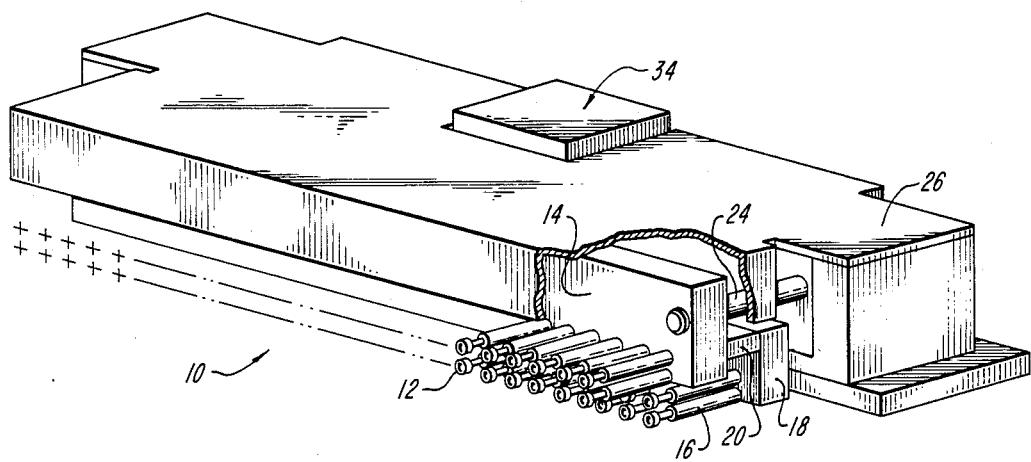
FIG. 1 is a perspective view illustrating the novel high-speed edge connector testing assembly of the instant invention.

Referring now to FIG. 1, generally designated at 10 is a perspective view of the novel high-speed edge connector testing assembly of the present invention. The edge connector testor 10 is cooperative with a test head or fixture of automatic testing equipment of the type disclosed in the commonly assigned United States patents referred to in the background of the invention. Those test fixtures include electronic circuit board receiving faces mounted for vertical movement relative to a stationary probe support board. The electronic circuit board, or more generally the unit under test (UUT), is received on the receiving face, and a vacuum condition is created so as to draw the unit under test downwardly into contact with probes supported by the probe support board, which probes are electrically connected to the automatic testing equipment. The edge connector testor 10 is mounted to the receiving face, and it is moved upwardly and downwardly therewith. Each unit under test, such as a computer and associated memory device, has an edge connector typically soldered or otherwise fastened to the unit under test along or spaced from an edge thereof. The embodiment of FIGS. 1 and 2 makes contact with the edge connectors of UUT's that are located a distance away from a physical edge, while the embodiment of FIG. 3 makes contact with edge connectors of UUT's that are substantially superposed on a physical edge thereof.

The assembly 10 includes plural edge connector contacting contacts 12 mounted in a plate or board 14. The contacts 12 are illustrated in two rows, it being appreciated that one or three or any other number of rows may be provided, the only requirement being that the number of rows of the probes 12 equal the number of rows of the contacts to be contacted thereby. The number of probes can be selected to equal the number of contacts to be contacted of a particular unit under test, or can be selected to provide a universal test pattern capable of contacting any one of a plurality of different units to be tested. The contacts 12 preferably are "POGO" spring-loaded probes that are individually removably frictionally retained in the member 14.

A second array of automatic testing equipment contacting contacts 16 are mounted to a board 18. The board 18 is fastened to the board 14 via a web 20, and occupies a position where the contacts 16 are behind and below the contacts 12. The lateral distance between the arrays of contacts 12 and 16 is selected to accommodate the offset in lateral position of the edge connector of the particular unit under test.

Figure 2:
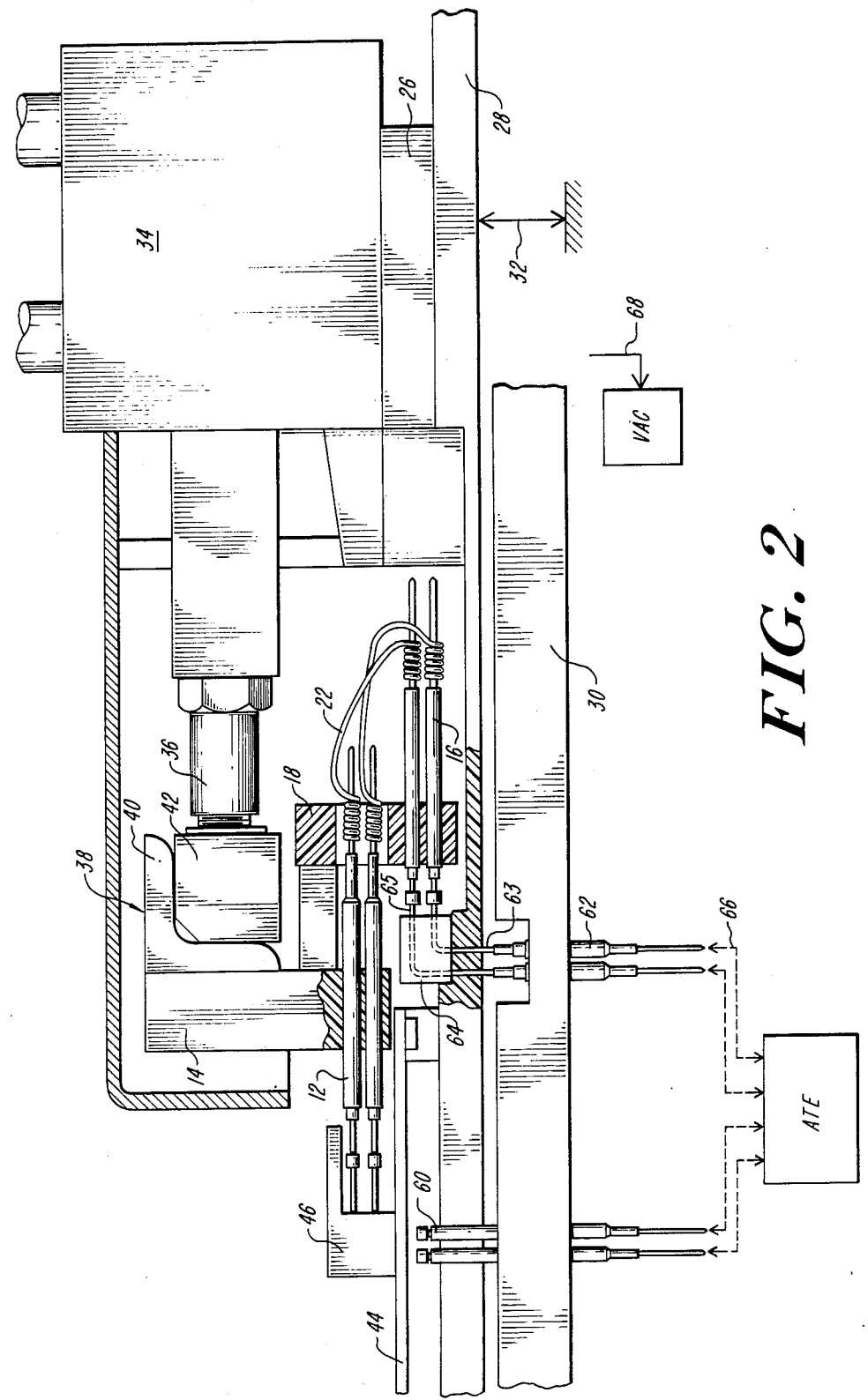
FIG. 2 is a partially sectional, partially pictorial side elevation thereof illustrating the assembly mounted to a test fixture of automatic testing equipment and in the condition of making contact with the edge connector of a unit under test.

The ends of the probes 12 remote from the spring loaded ends thereof are coupled with an associated one of the ends of the probes 16 remote from the spring loaded ends thereof via wire wraps 22 as seen in FIG. 2. The wire wraps 22 are non-flexing, and thus have a very long lifetime.

Replacement of the probes 12, 16 is easily accomplished simply by unplugging the spring-loaded contacts and replacing them with new or refurbished ones.

The board 14 is slidably mounted on linear bearings 24, fastened in cantilevered relation to housing 26, one adjacent each longitudinal end of the board. As can be seen in FIG. 2, the housing 26 is mounted for movement with a movable circuit board receiving face 28 of a test fixture for automatic testing equipment. The unit under test receiving face 28 is movable relative to a stationary probe support board 30 as schematically illustrated by an arrow 32. The face 28 is mounted for movement relative to the stationary plate 30 by any suitable means, the spring suspension and resilient peripheral support disclosed in the above identified and incorporated patents being the presently preferred embodiment.

An actuator generally designated 34 is mounted in the housing 26 for moving the board 14 reciprocally along the linear bearings 24. Although one actuator 34 located at the mid-point of the board 14 is illustrated in FIG. 1, it will be appreciated that a different number of actuators can be employed.

Referring now to FIG. 2, the actuator 34 includes a ram 36. The actuator 34 is preferably a pneumatic cylinder, and the ram 36 is reciprocally movable along the direction of its elongation. A coupling generally designated 38 is provided between the board 14 and the confronting end of the ram 36 of the cylinder 34. The coupling 38, insofar as the board is guided on the linear bearings 24 (FIG. 1), is preferably selected to be an axial coupling that directly transmits the force along the direction of movement of the ram of the cylinder, but which provides a play in directions transverse the direction of motion, so that there is no interference or jamming of the slide action along the linear bearings. In the preferred embodiment, the coupling 38 is a so-called "Tee"-coupling that includes a bracket 40 having a "Tee" slot therein fastened to the board 14, and a cooperative button head 42 threadably fastened or otherwise attached to the free end of the ram 36.

Figure 3:
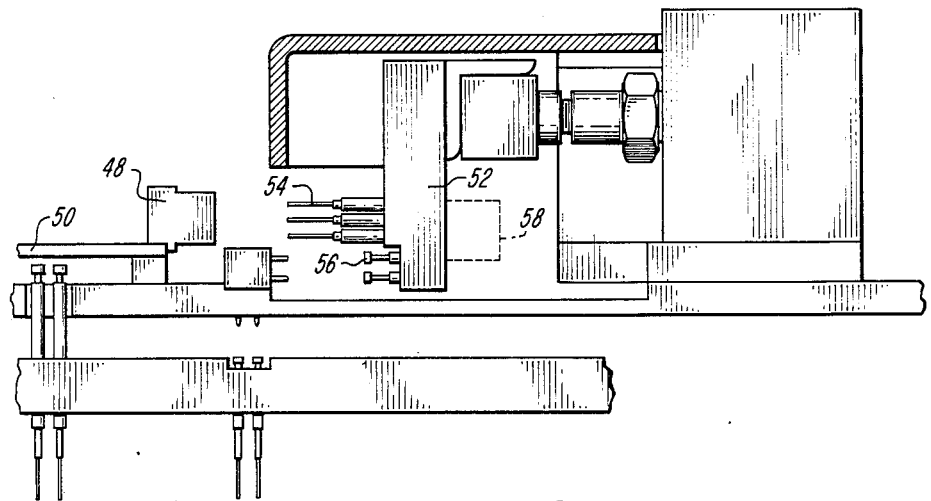
FIG. 3 is a partially schematic, partially pictorial side elevational view of an alternative embodiment of the invention, again illustrated as mounted to the test fixture of automatic testing equipment but in the non-contacting condition thereof.

The unit under test is identified with a numeral 44. As can be seen from the drawings, the edge connector 46 thereof is spaced a distance away from the physical edge of the unit under test 44. The distance of the connector 46 of the unit 44 from its edge is accommodated by the lateral offset in the probe support members 14, 18. As shown in FIG. 3, when the edge connector 48 is superposed on the physical edge of the unit under test 50, a single board 52 is alone sufficient for supporting the contacts of the edge contacting contacts 54 as well as for the test fixture contacting contacts 56. In the embodiment illustrated in FIG. 3, it may be noted that there are three rows of contacts 54 corresponding to the number of rows of the particular edge connector 48. It should also be noted that the three rows of contacts 54 mate electrically with two rows of contacts 56, the number of contacts 54 and the number of contacts 56 being equal, and that the contacts 54 are selectively electrically interconnected with the contacts 56 by non-flexing conductors illustrated schematically in dashed outline 58.

Returning now to FIG. 2, a plurality of spring-loaded POGO contacts 60 are stationarily fastened to the probe support board 30 for providing testing of circuit points of the unit under test 44.

Another plurality of spring-loaded POGO contacts 62 are stationarily fastened to the probe support board 30, which contacts 62 correspond in number to the number of the probes 16. The contacts 62 are aligned with contacts 63 disposed in a right-angled connector 64 mounted to the probe support board 30. Contacts 65 are internally connected with the contacts 63, and are aligned with the contacts 16. The connector 64 provides connection between the contacts 62 and the contacts 16. Any suitable right-angled connector, such as a right-angle header assembly, can be employed for the unit 64. The contacts 60, 62 are electrically connected to automatic testing equipment as schematically illustrated in dashed line 66.

In operation, vacuum is imparted to the movable UUT receiving face 28 as schematically illustrated by an arrow designated 68 in FIG. 2. The face 28 is moved downwardly in response to the vacuum bringing the contacts 63 into contact with the contacts 62 and the contacts 60 into contact with the intended circuit points of the circuit of the UUT 44 to be tested. The automatic testing equipment therewith makes electrical contact to the circuit points, and simultaneously, the contacts 63 contact the contacts 62, and the automatic testing equipment thereby makes electrical connection to the right-angle connector 64.

The actuator 34 is operative to move the ram 36 leftwardly in FIG. 2, and the board 14 and contacts 12 are moved leftwardly therewith. The contacts 12 plug into the edge connector 46, with each of the probe ends being received in a corresponding contact opening of the connector 46. Simultaneously with the contact of the connector 46, the probes 16 contact the contacts 65 of the right angled connector 64, whereby, the automatic testing equipment is electrically connected through the wires 22 to the probes 12, and thus to the contacts of the edge connector 46. The automatic testing equipment can therewith check the intended connection integrity (so-called in circuit testing) and or device function (functional testing). After testing is completed, the actuator 34 pulls the ram to the right in FIG. 2, moving the board 14 and therewith the probes 12 rightwardly, thereby breaking connection with the connector 46 and the right-angle connector 64. The vacuum is released, breaking the connection between the contacts 60 and the UUT test points as well as breaking the connection between the contacts 62 and the contacts 63 of the right-angled connector 64.

As should by now be apparent, the lengths of wire through which propagation occurs are by the present invention kept as short as is reasonably possible, so that both the settling transients and the propagation signal delays are minimized. The present invention has bee found to provide an order of magnitude improvement in the processing through-put, so that it provides an edge connector well suited for many of todays high-speed testing applications.

Many modifications of the presently disclosed invention will become apparent to those skilled in the art without departing from the scope of the appended claims.

What is claimed is:

1. A high-speed edge connector assembly for providing testing of an electronic circuit device having circuit points to be tested and an edge connector having contacts to be tested, comprising:
   a test fixture having a movable electronic circuit device receiving face and a stationary probe support face;

a first plurality of spring-loaded probes fastened to the probe support plate for providing a first plurality of stationary signal contacts defining an array for testing the circuit points of the electronic circuit device;

a right angled connector fastened to the electric circuit device receiving face having first and second pluralities of contacts in respective planes defined at a right angle to each other;

a second plurality of spring-loaded probes having ends fastened to the probe support plate for providing a second plurality of stationary signal contacts defining an array for connecting with said first plurality of contacts of said right-angled connector;

a third plurality of spring-loaded probes at least equal in number to the number of the contacts of the edge connector;

a fourth plurality of spring-loaded probes at least equal in number to the number of said third plurality of spring-loaded contacts; and means coupled to the third and fourth pluralities for so moving said fourth and said third pluralities of spring-loaded contacts that said third plurality of spring-loaded contacts selectively connects with said edge contacts, and said fourth plurality of spring-loaded contacts selectively connects with said second contacts.

2. The high speed edge connector assembly of claim 1, wherein said first and second pluralities of spring-loaded contacts are vertically upstanding and in parallel alignment.

3. The high speed edge connector assembly of claim 2, wherein said third and said fourth pluralities of spring-loaded contacts are horizontally oriented and in parallel alignment.

4. The high speed edge connector assembly of clam 3, wherein said moving means includes means for supporting said third and said fourth pluralities of contacts, and means coupled to said supporting means for moving said supporting means in linear translation reciprocally towards and away from the edge connector.

5. The high speed edge connector assembly of claim 4, wherein said supporting means coupled moving means is mounted to said movable electronic device receiving face.

6. The high speed edge connector assembly of claim 5, wherein said supporting means coupled moving means includes a carriage mounted to linear bearings, and an actuator for moving the carriage along the linear bearings.

7. The high speed edge connector assembly of claim 6, wherein said actuator is pneumatic and coupled to said carriage by means proving uniaxial force transmission and transaxial force play and slippage.

8. The high speed edge connector assembly of claim 4, wherein said fourth and third plurality of probes are supported by the same board.

9. The high speed edge connector assembly of claim 4, wherein said supporting means includes two laterally spaced-apart boards, wherein said fourth and third pluralities of spring-loaded contacts are respectively mounted to said laterally spaced-apart boards and are interconnected by a web.

10. The high speed edge connector assembly of claim 1, wherein said first, second, third, and fourth pluralities of spring-loaded contacts are spring-loaded contacts or equivalent.

* * * * *